United States Patent [19]

Sako et al.

[11] Patent Number: 5,781,567
[45] Date of Patent: Jul. 14, 1998

[54] DIGITAL CODING METHOD AND APPARATUS FOR THE CORRECTION OF BURST ERRORS

[75] Inventors: Yoichiro Sako, Chiba; Satoshi Otsuka; Tamotsu Yamagami, both of Kanagawa, all of Japan

[73] Assignee: Sony Corporation, Tokyo, Japan

[21] Appl. No.: 546,147

[22] Filed: Oct. 20, 1995

[30] Foreign Application Priority Data

Oct. 24, 1994 [JP] Japan ................. 6-258523

[51] Int. Cl.$^6$ ........................... H03M 13/00
[52] U.S. Cl. ........................ 371/39.1; 371/40.1
[58] Field of Search .................. 371/39.1, 37.5, 371/38, 41, 40.1; 369/59, 13

[56] References Cited

U.S. PATENT DOCUMENTS

| | | | |
|---|---|---|---|
| 4,788,685 | 11/1988 | Sako et al. | 371/37.5 |
| 4,821,253 | 4/1989 | Usui et al. | 369/54 |
| 4,907,215 | 3/1990 | Sako et al. | 369/59 |
| 5,379,305 | 1/1995 | Weng | 371/41 |
| 5,526,328 | 6/1996 | Oshima et al. | 369/13 |
| 5,602,857 | 2/1997 | Zook et al. | 371/40.1 |

*Primary Examiner*—Reba I. Elmore
*Assistant Examiner*—McDievnel Marc
*Attorney, Agent, or Firm*—Frommer Lawrence & Huag LLP; William S. Frommer

[57] ABSTRACT

Error-correcting apparatus and method for detecting and correcting a burst error affecting a plurality of reproduced signals representing adjacent data words groups the signals, calculates syndromes, determines the positions of errors in the reproduced signals and detects burst errors.

17 Claims, 9 Drawing Sheets

Bytes →

| i \ j | 0 | 1 | ... | 7 | 8 | 9 | 10 | 11 | 12 | 13 | 14 | 15 |
|---|---|---|---|---|---|---|---|---|---|---|---|---|
| 0 | D0 | D1 | | D7 | D8 | D9 | D10 | D11 | D12 | D13 | D14 | D15 |
| 1 | D16 | D17 | | D23 | D24 | D25 | D26 | D27 | D28 | D29 | D30 | D31 |
| 2 | D32 | D33 | | D39 | D40 | D41 | D42 | D43 | D44 | D45 | D46 | D47 |
| 3 | D48 | D49 | | D55 | D56 | D57 | D58 | D59 | D60 | D61 | D62 | D63 |
| 4 | D64 | D65 | | D71 | D72 | D73 | D74 | D75 | D76 | D77 | D78 | D79 |
| 5 | D80 | D81 | | D87 | D88 | D89 | D90 | D91 | D92 | D93 | D94 | D95 |
| 6 | D96 | D97 | | D103 | D104 | D105 | D106 | D107 | D108 | D109 | D110 | D111 |
| 7 | D112 | D113 | | D119 | D120 | D121 | D122 | D123 | D124 | D125 | D126 | D127 |
| ... | | | | | | | | | | | | |
| 126 | D2016 | | | D2023 | D2024 | D2025 | D2026 | D2027 | D2028 | D2029 | D2030 | D2031 |
| 127 | D2032 | | | D2039 | D2040 | D2041 | D2042 | D2043 | D2044 | D2045 | D2046 | D2047 |
| 128 | U.D. | U.D. | | U.D. | U.D. | U.D. | U.D. | U.D. | U.D. | U.D. | U.D. | U.D. |
| 129 | U.D. | U.D. | | U.D. | U.D. | U.D. | U.D. | U.D. | U.D. | U.D. | U.D. | U.D. |
| 130 | U.D. | U.D. | | CRC1 | CRC1 | CRC2 | CRC3 | CRC4 | CRC5 | CRC6 | CRC7 | CRC8 |
| 131 | E1.1 | E2.1 | | E1.1 | E9.1 | E10.1 | E11.1 | E12.1 | E13.1 | E14.1 | E15.1 | E16.1 |
| 132 | E1.2 | E2.2 | | E8.2 | E9.2 | E10.2 | E11.2 | E12.2 | E13.2 | E14.2 | E15.2 | E16.2 |
| 133 | E1.3 | E2.3 | | E8.3 | E9.3 | E10.3 | E11.3 | E12.3 | E13.3 | E14.3 | E15.3 | E16.3 |
| 134 | E1.4 | E2.4 | | E8.4 | E9.4 | E10.4 | E11.4 | E12.4 | E13.4 | E14.4 | E15.4 | E16.4 |
| ... | | | | | | | | | | | | |
| 143 | E1.13 | E2.13 | | E8.13 | E9.13 | E10.13 | E11.13 | E12.13 | E13.13 | E14.13 | E15.13 | E16.13 |
| 144 | E1.14 | E2.14 | | E8.14 | E9.14 | E10.14 | E11.14 | E12.14 | E13.14 | E14.14 | E15.14 | E16.14 |
| 145 | E1.15 | E2.15 | | E8.15 | E9.15 | E10.15 | E11.15 | E12.15 | E13.15 | E14.15 | E15.15 | E16.15 |
| 146 | E1.16 | E2.16 | | E8.16 | E9.16 | E10.16 | E11.16 | E12.16 | E13.16 | E14.16 | E15.16 | E16.16 |

147 Code Words

| Codewords | Bytes | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 128 | P1 | P2 | P3 | P4 | P5 | P6 | P7 | P8 | P9 | P10 | P11 | P12 | P13 | P14 | P15 | P16 |
| 129 | P17 | P18 | P19 | P20 | P21 | P22 | P23 | P24 | P25 | P26 | P27 | P28 | P29 | P30 | P31 | P32 |
| 130 | P33 | P34 | P35 | P36 | P37 | P38 | P39 | P40 | CRC1 | CRC2 | CRC3 | CRC4 | CRC5 | CRC6 | CRC7 | CRC8 |

FIG. 9

DIGITAL CODING METHOD AND APPARATUS FOR THE CORRECTION OF BURST ERRORS

BACKGROUND OF THE INVENTION

The present invention relates to a digital coding method and apparatus for correcting digitally encoded data which have been corrupted by burst errors. This invention is particularly suited for the reproduction of encoded data from data storage media but is also advantageously implemented in other channel coding systems.

The reproduction of recorded digital data from a storage medium is commonly an imperfect process. A variety of different physical and environmental conditions can influence the recording and reproduction processes and change the characteristics of a storage medium itself to cause errors in the reproduced data. For example, in magnetic, magneto-optical, and optical disk systems, the surface of the disk may suffer from irregularities such as bubbles in the coating of the disk, scratches marring the disk surface, or the like, resulting from an imperfect manufacturing process or from mishandling of the disk. Additionally, dust and condensation frequently interfere with the operation of recording and reproducing heads utilized in such systems, causing the system to lose synchronization (tracking) with the storage medium or otherwise malfunction, resulting in the misrecording or misreproduction of data.

To prevent the reproduction of incorrect data, allocation strategies have been developed to enable a data storage system to physically avoid reading corrupted portions of a storage medium. For example, during the manufacturing of magneto-optical disks, those data sectors of a particular disk determined to be faulty are simply removed from the data map for the disk. Data intended for the faulty sectors are rerouted to alternate adjacent sectors of the disk so that data is not recorded on or reproduced from the faulty sectors and instead, the alternate sectors are utilized. If a sector becomes corrupted after ordinary use of the disk has commenced, the data storage system avoids the corrupt sector by rerouting data intended for or requested from that sector to an alternate sector established in a dedicated region of the disk. A significant drawback of such error avoidance techniques is the allocation of considerable portions of the storage medium as "alternate" areas of data storage, necessarily reducing the overall storage capacity of the medium and, in some instances, increasing the time required to access data. Further, such a technique is incompatible with read-only storage media, such as a compact disc read-only memory (CD-ROM).

As an alternative to physical error avoidance techniques, error correction coding methodologies utilizing the reproduced data have been developed to correct error-filled data streams. According to a common error correction technique for writable disk media, portions of data to be recorded are augmented with code data such that the augmented (coded) portions of data satisfy specific mathematical relationships. Upon reproduction of the coded data, some errors introduced by the recording and reproducing processes can be detected by recognizing that the reproduced data does not satisfy the original mathematical relationships. Upon detection of an error, the data reproduction process may be restarted in an attempt to correctly reproduce the data. Alternatively, in certain circumstances, the original recorded data can be reconstructed from the inaccurately reproduced data by altering the reproduced data so that it satisfies the original mathematical relationships. Cyclic redundancy check (CRC) codes and parity bits are often employed for these purposes. Besides reducing the storage capacity of the disk by recording code data along with the information data, such techniques are often overwhelmed by consecutive errors, resulting in the misdetection of errors and necessitating the repeated reproduction of inaccurately reproduced data.

Errors in a stream of reproduced data can be roughly categorized as either random errors, which affect relatively short sequences of data and appear at "random" intervals, or burst errors, which affect much longer contiguous sequences of data. Due to the often considerable amount of contiguous data typically corrupted by a burst error, correction of such an error presents a difficult coding challenge.

Reed-Solomon (RS) codes (Reed and Solomon, 1960) have proven to be a useful coding technique for detecting and correcting burst errors in satellite communications systems and magnetic and optical recording/reproducing systems. RS codes are symbol-oriented non-binary BCH (Bose, Chaudhuri and Hocquenghem) codes wherein the symbols may represent binary m-bit words. According to a simple application of this technique, given a data stream wherein each word contains k symbols, a codeword consisting of n symbols is produced by augmenting each word of information with n-k "check" symbols. The "distance" between two codewords is defined as the number of corresponding positions in the codewords in which the two codewords contain different symbols. For example, the distance between codewords "vghb" and "cghc" is two because the first and fourth positions in the codewords differ. It follows that the "minimum distance" d for the code can be defined as the least "distance" between any two possible codewords. The three parameters n, k, and d are thus employed to distinguish among codes, e.g. (n, k, d) RS code.

Both the error detecting ability and the error correcting ability of a RS error correcting code depend upon the minimum distance of the code. Error correcting ability of a code is governed by the equation $$d \geq 2t+1 \qquad (1)$$

where d is the minimum distance and t is the number of erroneous symbols in each codeword that can be corrected. For example, if the minimum distance of a code equals 17, then no more than 8 symbols in each codeword can be corrected. Error detecting ability of a code is governed by the equation $$u = d-(2t+1) \quad (u \geq 0) \qquad (2)$$

where u is the number of erroneous symbols in each codeword that can be detected. Therefore, if a code having a distance of 17 is chosen such that 8 symbols in each codeword can be corrected, then zero (0) symbols in each codeword can be detected.

Extension of the error detection and error correction capabilities of an already efficient RS code thus typically involves increasing the code's minimum distance d. The minimum distance d is increased by increasing the number of n-k check symbols added to each word of data and, consequently, reducing the amount of information that can be stored on the disk. Such an increase in d also increases the redundancy of the code.

OBJECTS AND SUMMARY OF THE INVENTION

An object of the present invention is to provide a coding apparatus and method for detecting and correcting relatively long burst errors.

Another object of the present invention is to provide a coding apparatus and method for detecting and correcting burst errors in reproduced data originally encoded with a code that cannot detect or correct the burst error itself under ordinary circumstances.

Yet another object of the present invention is to extend the error-detecting and error-correcting effectiveness of a code without increasing its minimum distance.

Still another object of the present invention is to provide a coding apparatus and method for determining the location and size of a burst error in a quantity of data.

In accordance with an aspect of the present invention, an error-correcting apparatus for detecting and correcting a burst error affecting a plurality of reproduced signals representing adjacent data words is provided. The apparatus includes a grouping device for dividing the reproduced signals into groups of signals, each group containing a predetermined number of adjacent data words and sharing at least one data word with another group. The apparatus further includes a calculating device, responsive to the groups of signals, for producing a plurality of syndrome signals representing a plurality of syndromes calculated for each group of signals and a determining device for determining the position of an error, if any, in each group of signals as a function of the syndrome signals. A burst error detecting device detects a burst error in the reproduced signals as a function of the determined positions of a plurality of errors.

Other objects, features, and advantages according to the present invention will become apparent from the following detailed description of illustrated embodiments when read in conjunction with the accompanying drawings in which the same components are identified by the same reference numerals.

DETAILED DESCRIPTION OF THE PREFERRED EMBODIMENTS

Figure 1:
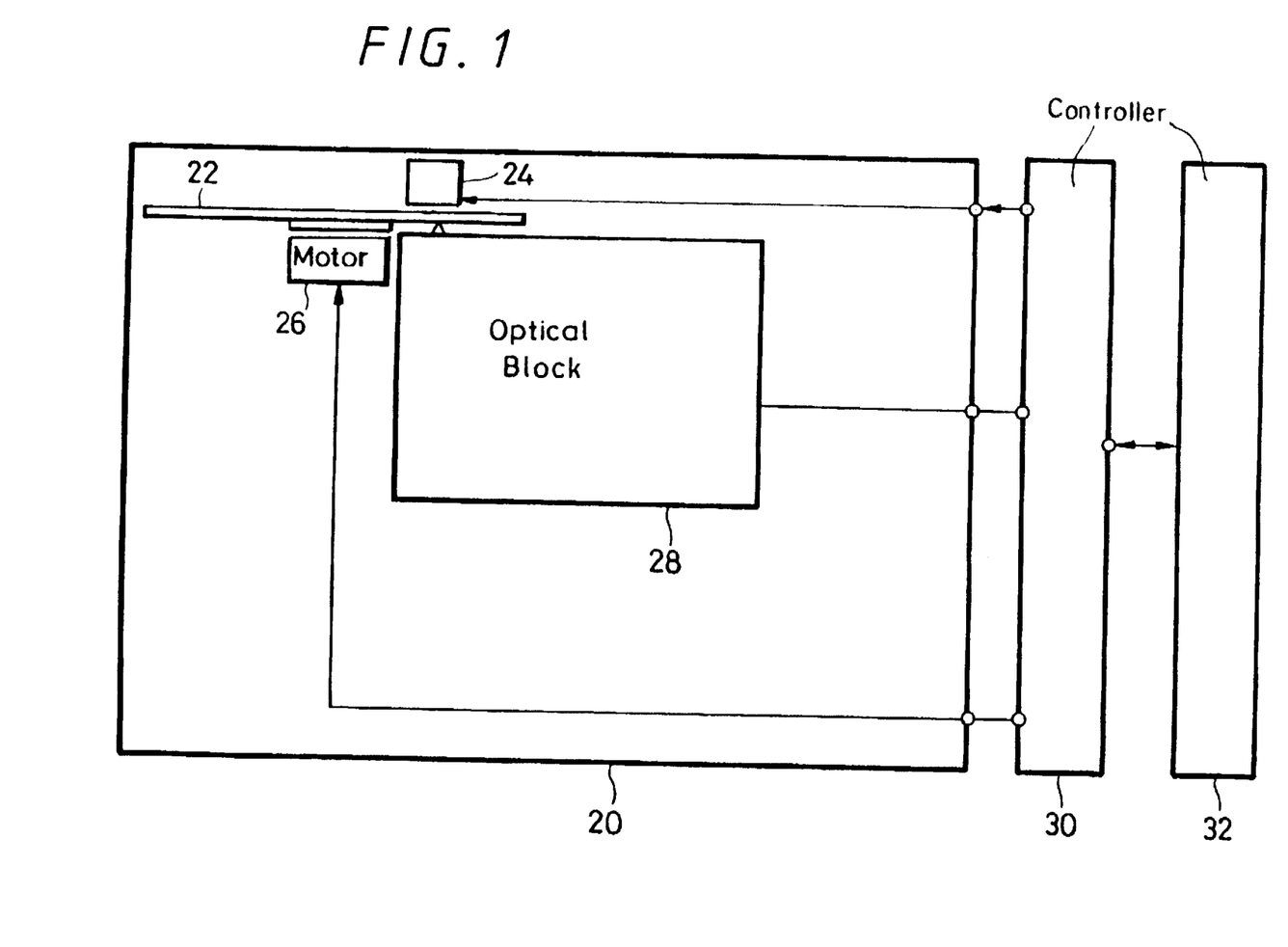
FIG. 1 is a block diagram of an optical disk drive system according to the present invention.

FIG. 1 illustrates an optical disk drive system incorporating a coding apparatus and a decoding apparatus according to the present invention. The system includes an optical disk drive 20 and a disk drive controller 30. Also illustrated are an optical disk 22 and a host computer 32. Preferably, disk drive 20, optical disk 22, and host computer 32 are conventional devices. In particular, computer 32 is preferably a microprocessor-based system which requests that data be read from, and, where feasible, written to, and erased from disk 22.

In a typical implementation, disk drive 20 is configured to service at least one type of disk media and preferably accommodates several different types, such as CD-ROMs, partial CD-ROMs, magneto-optical disks, write-once disks, optical disks incorporating phase-change media, and partial disks having a writable area (RAM) and a read-only area (ROM). Disk 22 may be permanently fixed within drive 20 or, preferably, removably engaged with the drive by means of a disk loading/unloading mechanism (not shown). Drive 20 is operable to read data from, write data to, and erase data from the disk, where the nature of the disk media permits.

Disk drive 20 includes a magnetic head 24, a spindle motor 26, and an optical block 28, each of which are coupled to controller 30. Under the control of controller 30, magnetic head 24 is operable to apply a magnetic field of selected intensity and polarity to disk 22 to write and erase data on disk 22. Spindle motor 26 is mechanically coupled to disk 22 (as by a turntable) and, in response to control signals therefrom, rotates disk 22.

Optical block 28 is optically coupled to disk 22 and, in response to control signals from controller 30, is operable to read, write, and erase data on disk 22, where the nature of the disk allows. Disk 22 is positioned such that the data encoded thereon or therein is accessible to optical block 28. Preferably, optical block 28 incorporates a laser device for applying a beam of light to selected portions of the disk; a photodetector for detecting light reflected from the disk; and a tracking device for determining and adjusting the location of the beam as it scans the disk.

During a read operation, the optical block illuminates a portion of disk 22, generates a data signal corresponding to the light reflected from the disk, and supplies the data signal to the controller. For magneto-optical and other like disks, optical block 28 and magnetic head 24 are operated together by controller 30 to write and to erase selected portions of the disk. In a typical write operation, optical block 28 heats a portion of disk 22 to a specific temperature and magnetic head 24 applies a magnetic field thereto. The magnetic field is varied according to a data signal supplied by controller 30. Similarly, in a typical erasure operation, magnetic head 24 applies a magnetic field to one side of disk 22 while optical block 28 applies a relatively intense laser beam of light to the other side of disk 22. The above descriptions are provided merely as examples of read, write, and erase operations, as the specifics of each operation depends upon the particular configuration and composition of the disk.

Disk drive controller 30 controls the flow of data between drive 20 and computer 32, processes such data, and controls the operation of disk drive 20. In response to a data write command from computer 32, controller 30 receives data from the computer, encodes the data, supplies the encoded data to optical block 28, and controls optical block 28 to write the encoded data to the disk. In response to a data read command from computer 32, controller 30 controls the optical block to read recorded data from the disk and supply the reproduced data to the controller. Controller 30 decodes and error-corrects the data and supplies the corrected data to computer 32. In response to a data erase command from computer 32, controller 30 controls optical block 28 and magnetic head 24 to erase a portion of disk 22.

Figure 2:
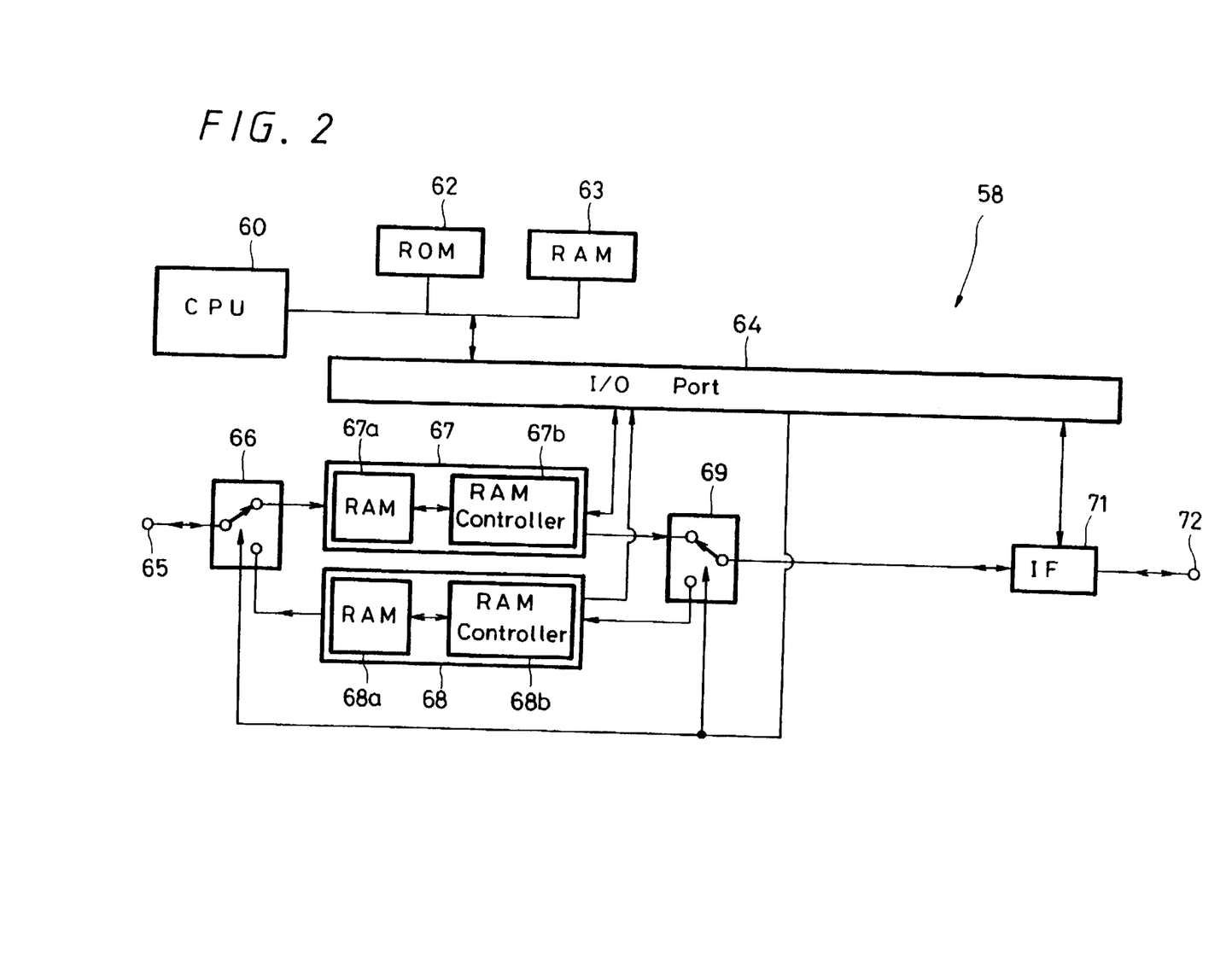
FIG. 2 is a block diagram of a drive controller for the system of FIG. 1.

An error correcting section 58 of disk drive controller 30 is illustrated in FIG. 2. Error correcting section 58 includes central processing unit (CPU) 60, read-only memory (ROM) 62, random access memory (RAM) 63, i/o port 64, nodes 65 and 72, switches 66 and 69, decoder 67, encoder 68, and interface 71. At node 65, section 58 is coupled to a remaining portion (not shown) of disk drive controller 30. The remaining portion of disk drive controller 30 will not be described herein in detail as the structure and function of this remaining portion is conventional in nature. The remaining portion of controller 30 generates signals for controlling and coordinating the various elements of disk drive 20 to perform reading, writing, erasing, and like functions. Also, controller 30 converts data between the encoded data format used by error correcting section 58 and a data format appropriate to the specific type of disk 22. During a read operation, encoded data reproduced from disk 22 is supplied to section 58 at node 65. During a write operation, section 58 supplies encoded data to node 65 for further processing by the remaining portion of controller 30 and eventual recording on disk 22.

Node 65 is selectably coupled to either an input of decoder 67 or an output of encoder 68 via switch 66 which is controlled by CPU 60. Node 72, through interface 71, is selectably coupled to either an output of decoder 67 or an input of decoder 68 via switch 69 which is controlled by CPU 60. Node 72 is also coupled to computer 32. Interface 71 is controlled by CPU 60 to route data between computer 32, CPU 60, and switch 69.

Each of encoder 68 and decoder 67 are controlled by CPU 60 through i/o port 64. Encoder 68 is comprised of RAM 68a and RAM controller 68b while decoder 67 is comprised of RAM 67a and RAM controller 67b. RAM 68a and RAM 67a are conventional memory elements, preferably having at least the capacity to store the equivalent of two sectors of data stored on disk 22, for example 2352 bytes.

Decoder 67 detects and corrects errors in reproduced data according to one or more error detection and error correction methods. Such methods include RS coding, CRC coding, and the like. For example, RAM controller 67b may correct errors which are less than 9 bytes in length by utilizing RS code parity data. The RAM controller may then search a sector for bursts of errors which are greater than 8 bytes in length and note the location and length of such burst errors. Additional details regarding such error correction techniques will be provided below. RAM controller 67b controls RAM 67a to store data supplied from switch 66 and to supply corrected data to switch 69 and, optionally, to CPU 60. RAM controller 67b may correct the data itself under the control of CPU 60 or supply data to CPU 60 for correction.

Encoder 68 encodes data for storage on disk 22 according to one or more error correction coding techniques. Such methods include RS coding, CRC coding, and the like. One or more types of parity data or error checking data may be generated and incorporated into or otherwise associated with the informational data and other data to be recorded. Additional details regarding such error correction coding techniques will be provided below. RAM controller 68b controls RAM 68a to store data supplied from switch 69 and to supply encoded data to switch 65 and, optionally, to CPU 60. RAM controller 68b may encode the data itself under the control of CPU 60 or supply data to CPU 60 for encoding.

CPU 60 is a central processing unit and may comprise a microprocessor, such as the 80486 produced by the Intel Corporation. CPU 60 is coupled to each of ROM 62, RAM 63 and i/o port 64. ROM 62 is a conventional memory element for non-volatile storage of various program data for CPU 60, parameter data for the encoding/decoding processes, and like data. RAM 63 is also a conventional memory element and is used by CPU 60 for the temporary storage of data.

In response to a data request from computer 32, CPU 60 configures switch 66 to route data reproduced from disk 22 to decoder 67. Decoder 67 is controlled to perform error detection and/or error correction processes upon the reproduced data and to supply the corrected or otherwise processed data to switch 69 and/or CPU 60. Data supplied to switch 69 is routed to computer 32.

When data is supplied by computer 32 for recording on disk 22, CPU 60 configures interface 71 and switch 69 to route the data to encoder 68. Encoder 68 is controlled to perform error correction coding and error detection coding of the data and to supply the encoded or otherwise processed data to switch 65 and/or CPU 60. Data supplied to switch 66 is routed through node 65 to the remainder of controller 30 for subsequent storage on disk 22.

In an alternate embodiment, the decoding and encoding processes are performed entirely or in significant part by CPU 60.

Figure 3:
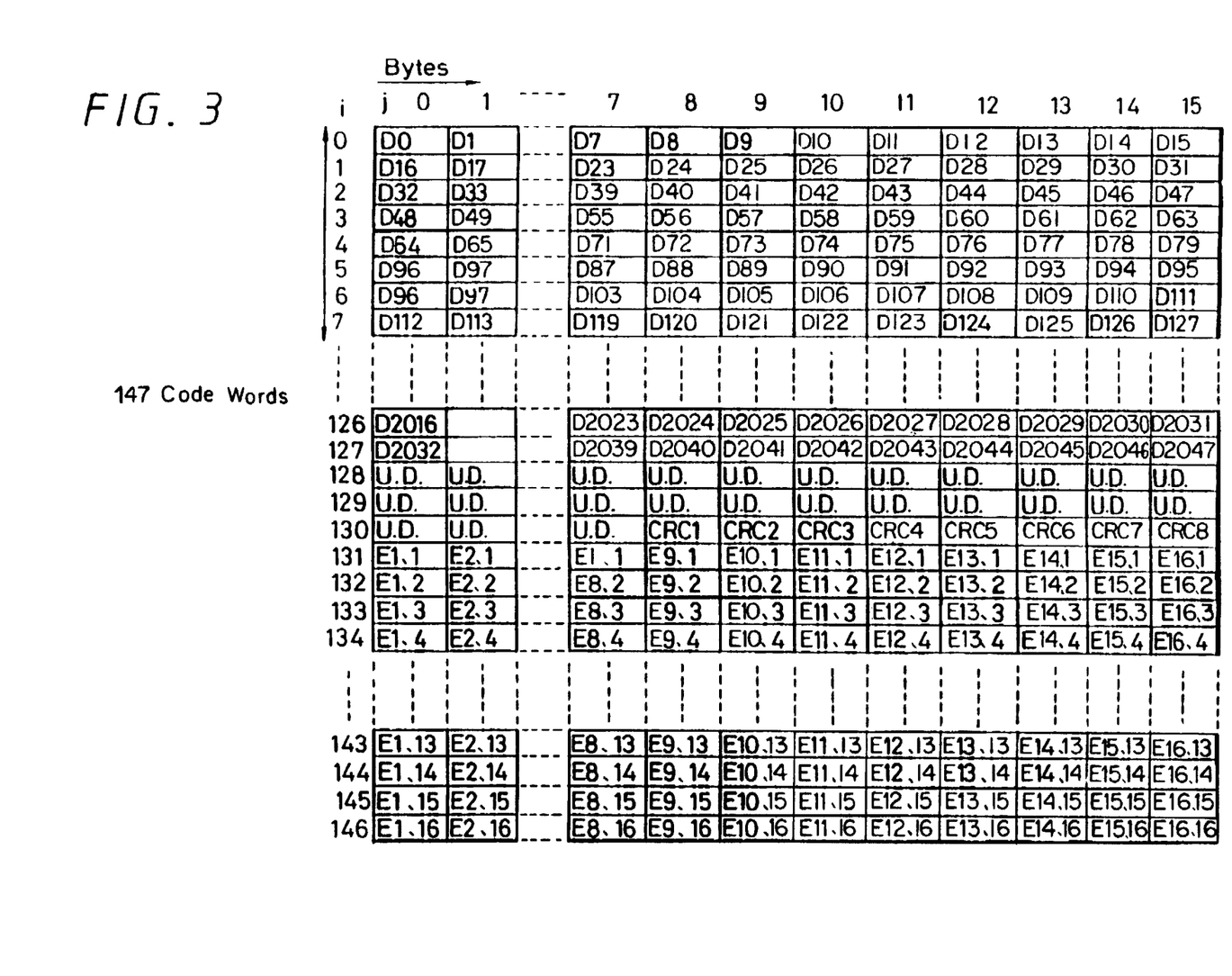
FIG. 3 is a table of the data allocation of a sector of a storage medium.

FIG. 3 presents a table illustrating an exemplary sector format of a disk storage medium incorporating error correction data. The vertical axis indicates codewords 0–146, represented by the variable i, while the horizontal axis indicates the individual bytes 0–15 in each codeword i, represented by the variable j, thereby mapping a 2352 byte storage area. Entries in the table incorporating the prefix "D" are information data-while those entries incorporating the prefix "CRC" are error-checking parity data for data areas D0–D2047 and for the undefined (U.D.) areas which optionally, may contain user-defined data. Entries incorporating the prefix "E" are RS code parity data for the data "directly above" them, e.g. data (E1,1)–(E1, 16) are parity data for D0, D16, D32 . . . D2032 and U.D. areas (128,0), (129,0), and (130,0) and data (E2,1)–(E2, 16) are parity data for D1, D17, D33 . . . D2033 and U.D. areas (128,1), (129,1), and (130,1). As indicated by the arrows, the storage area is traversed left-to-right and up and down.

In the preferred embodiment, encoder 68 and decoder 67 code and decode, respectively, parity data (E1,1)–(E16,16) with a (147, 131, 17) RS code wherein each data symbol consists of an 8 bit binary byte. Over a Galois field of $GF(2^8)$ the code is generated based on the primitive polynomial $$P(x)=x^8+x^5+x^3+x^2+1$$

and the generator polynomial $$G_c(x) = \prod_{i=120}^{135} (x+\alpha^i) \quad (3)$$

The elements of the field are $\alpha^i=(\beta^i)^{88}$, where $\beta$ is a primitive root of P(x). The value of the n-th bit in a byte is the coefficient of the n-th power of $\beta$, n ranging from 0 to 7, when $\beta$ is expressed on a polynomial basis. The 256 check bytes of the RS code are computed over the user data, the 40 U.D. bytes and the 8 CRC bytes. The corresponding five information polynomials utilized are $$I_{cj}(x) = \sum_{i=0}^{130} (B_{i,j})x^i \quad (4)$$

where $0 \leq j \leq 15$, and $B_{i,j}$ refers to the data at location (i,j) in the sector. The contents of the 16 check bytes for each polynomial $I_{cj}(x)$ are defined by the sixteen residual polynomials $R_{cj}(x) = I_{cj}(x) \ X^{16} \mod G_c(x)$. The storage locations for the coefficients of the polynomials are specified by $$R_{cj}(x) = \sum_{t=1}^{16} (E_{(j+1),t}) x^{16-t} \quad (5)$$

As a simple example, the coding and decoding processes of the present invention will be described in the following in connection with a (134, 131, 4) RS code based on the primitive polynomial $$P(x) = x^8 + x^4 + x^3 + x^2 + 1$$

and the generator polynomial $$G(x) = (x+1)(x+\alpha)(x+\alpha^2)$$

where the root of the primitive polynomial is $\alpha \in GF(2^8)$. To determine the presence of errors in a segment of data, check syndromes are produced and solved to determine the position of the errors and error values to correct the errors. In the case where two symbol errors have occurred at the i-th and j-th symbols, syndromes S0, S1, and S2 are produced as follows:

$$S0 = e_i + e_j \quad (6)$$

$$S1 = \alpha^i e_i + \alpha^j e_j \quad (7)$$

$$S2 = \alpha^{2i} e_i + \alpha^{2j} e_j \quad (8)$$

wherein $\alpha^k$, k=0, 1, 2, is an error locator (position) within the segment, and $e_i$ and $e_j$ are error values. Since equations S0, S1, and S2 together contain a total of four unknowns $\alpha^i$, $\alpha^j$, $e_i$, and $e_j$, the equations (6) through (8) cannot be solved directly. Since burst errors are sought, it can be assumed that two successive symbol errors are principally responsible for the errors, and hence the positions of the errors are assumed to be adjacent such that j=i+1. Simplifying syndromes S0, S1 and S2 yields:

$$S0 = e_i + e_{i+1} \quad (9)$$

$$S1 = \alpha^i e_i + \alpha^{i+1} e_{i+1} \quad (10)$$

$$S2 = \alpha^{2i} e_i + \alpha^{2i+1} e_{i+1} \quad (11)$$

When equation (9) is multiplied by $\alpha^i$ and equation (10) is added to the product, the following equation (12) is obtained:

$$\alpha^i S0 + S1 = \alpha^i (1+\alpha) e_{i+1} \quad (12)$$

When equation (10) is multiplied by $\alpha^i$ and equation (11) is added to the product, the following equation (13) is obtained:

$$\alpha^i S1 + S2 = \alpha^{2i+1}(1+\alpha) e_{i+1} \quad (13)$$

When equation (12) is multiplied by $\alpha^{i+1}$ and equation (13) is added to the product the following equation (14) is obtained:

$$\alpha^{i+1}(\alpha^i S0 + S1) + \alpha^i S1 + S2 = 0 \quad (14)$$

Expanding equation (14) we obtain:

$$\alpha S0 \cdot \alpha^{2i} + (1+\alpha) S1 \cdot \alpha^i + S2 = 0 \quad (15)$$

Equation (15) is a quadratic equation of $\alpha^i$, having one root when S0=0 and two roots when S0≠0. An actual error is located at the position indicated by one of these roots. Without further information, the exact location of the error cannot be specified, but at least the presence of an error is verified and the location of the error is limited to either of the two roots.

To resolve this problem, a solution can be assumed and then verified. Assuming i=1, $e_i$=1, and $e_j$=$\alpha$, it follows that j=2 and that syndromes S0, S1, and S2 can be expressed as follows:

$$S0 = \alpha + 1 \quad (16)$$

$$S1 = \alpha + \alpha^3 \quad (17)$$

$$S1 = \alpha^2 + \alpha^5 \quad (18)$$

Substituting equations (16), (17), and (18) into equation (15) we obtain:

$$\alpha(\alpha+1)\alpha^{2i} + (1+\alpha)(\alpha+\alpha^3)\alpha^i + (\alpha^2+\alpha^5) = 0 \quad (19)$$

Rearranging and simplifying produces:

$$\alpha^{2i} + (1+\alpha^2)\alpha^i + \alpha(1+\alpha+\alpha^2) = 0 \quad (20)$$

Further rearranging yields:

$$(\alpha^i + \alpha)(\alpha^i + 1 + \alpha + \alpha^2) = 0 \quad (21)$$

Therefore, $\alpha^i = \alpha$ or $\alpha^i = \alpha^2 + \alpha + 1 = \alpha^{198}$ and consequently i=1 or i=198. Since we are utilizing in this example a (134, 131, 4) RS code, i is limited to values ranging between 0 and 133. Thus, we conclude that i=1. Of course, other available error or parameter information can be used to limit the possible values of i.

Substituting i=1 into equation (12) and considering equations (16) and (17), we obtain:

$$\alpha(\alpha+1) + (\alpha+\alpha^3) = \alpha(1+\alpha) e_{i+1} \quad (22)$$

Therefore, $e_{i+1} = \alpha$ and, according to equation (16), $\alpha+1 = e_i + \alpha$, and hence $e_i = 1$. Thus, the assumed solution is verified.

Applying the above-described methodology to the preferred (147, 131, 17) RS code, detection of 12 successive errors, i.e. a burst error having a length of 12, can be achieved upon processing the corresponding data and parity data by generating 12 check syndromes S0–S12 as follows:

$$S0 = \sum_{m=0}^{11} \alpha^{120(i+m)} e_{i+m} \quad (23)$$

$$S1 = \sum_{m=0}^{11} \alpha^{121(i+m)} e_{i+m} \quad (24)$$

$$S2 = \sum_{m=0}^{11} \alpha^{122(i+m)} e_{i+m} \quad (25)$$

$$\vdots$$

$$S11 = \sum_{m=0}^{11} \alpha^{131(i+m)} e_{i+m} \quad (26)$$

In order to detect 12 successive errors, 13 unknowns i ($\alpha^i$) and $e_i$, $e_{i+1}$, ... $e_{i+11}$ have to be determined. A polynomial of degree 12 with respect to $\alpha^i$ is constructed from the syndromes S0–S12, and 12 possible values or "candidates" for i are determined (for 11, 10, and 9 successive errors, candidates before and after the 12 candidates are available as solutions). In a similar manner, 12 candidates for i can be determined from each of the sets of syndromes S1–S13, S2–14, and S3–S15. If a common i is found, then it can be recognized as an error position. Once i is known, $e_i$ to $e_{i+11}$ can be determined. As an alternative method, i can also be determined by substituting assumed values of i into the polynomial of degree 12 and confirming whether the result is 0 or not.

By implementing the above algebraic process, decoder 67 can determine the location and the magnitude of the burst error and subsequently employ an appropriate correction process to recover the original data. In a preferred embodiment, decoder 67 substitutes possible values of i into the polynomial of degree 12 to determine if the particular value is a root thereof and thus determines the existence of an error at that position.

Figure 4:
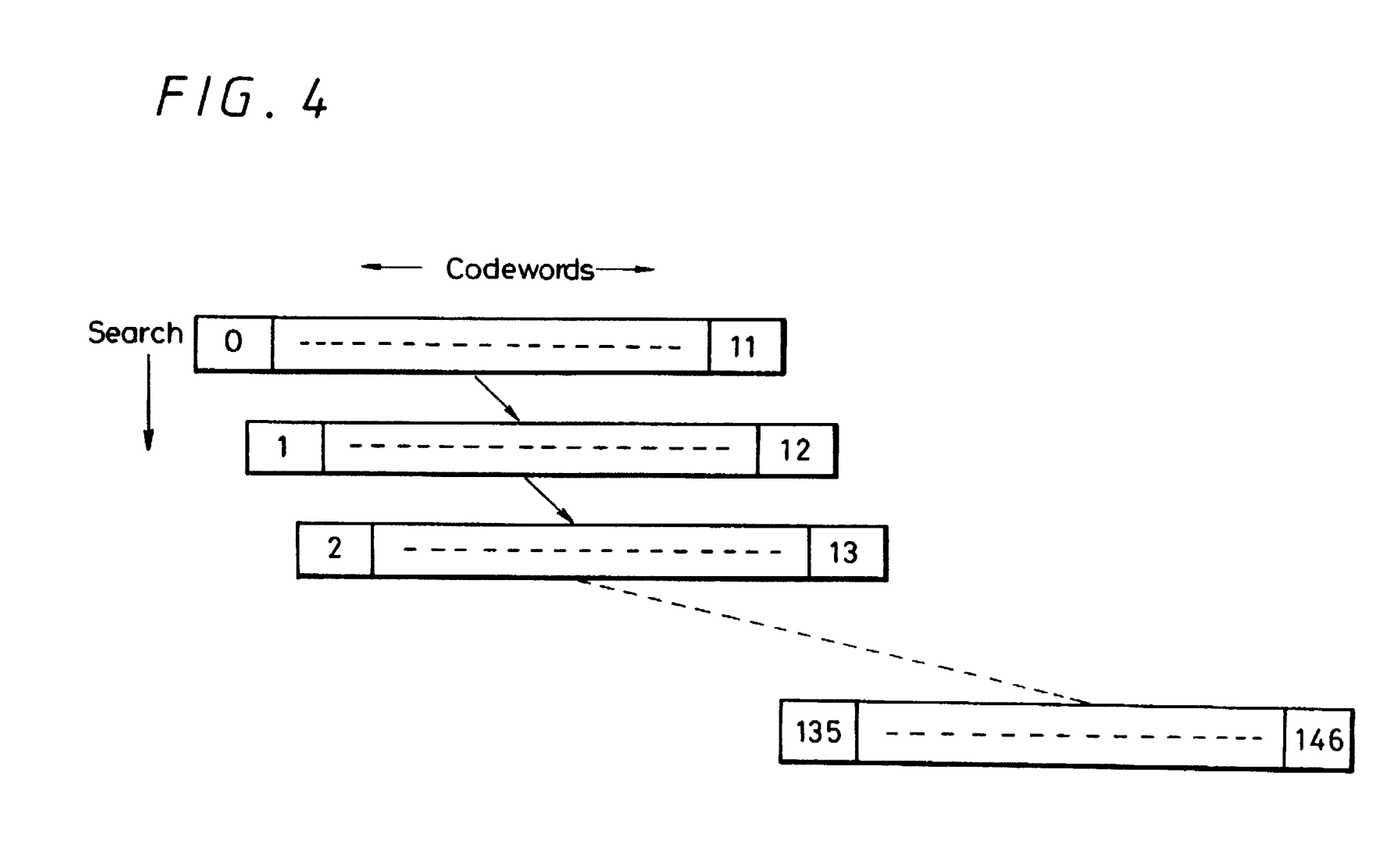
FIG. 4 is a diagram illustrating one search operation according to an embodiment of the present invention.

FIG. 4 illustrates a "search" process according to the present invention from which the position and the length of a burst of errors can be determined. Referring to the sector map of FIG. 3, searching is conducted "down" each of the j columns in 12 byte segments, each segment offset from the next by one byte. For ease of explanation, FIG. 4 depicts horizontally successive searches of a single column consisting of corresponding bytes of 147 codewords, e.g. 12 byte segments of data comprising byte 1 of codewords 0–11, 1–12, 2–13, ... 135–146 are searched successively. Although it is preferred that the search be conducted with 12 byte segments, a larger or smaller number of bytes per segment can be used. It has been found that a 12 byte segment is sufficiently large for burst error detection and results in a risk of erroneous error correction which is acceptably low. The risk of erroneous error correction increases as search segment size increases.

Decoder 67 searches each column of each sector in 12 byte segments, each segment offset from the next by one byte, to detect the presence of burst errors. According to the process described above, decoder 67 appropriately processes the 12 byte segment along with the corresponding parity data and substitutes each positional value into the corresponding polynomial of degree 12 to find those positions at which an error has occurred, e.g. where the polynomial =0. Where an error is detected, the results obtained from polynomials produced by syndromes S0–S12, S1–S13, S2–S14, and S3–15 are compared to confirm the error. Alternatively, the absence of an error may similarly be verified. In the illustrated embodiment, 136 searching processes are carried out on each column and, optionally, the results of the searches are compared to each other to verify the positions of detected errors.

Figure 5:
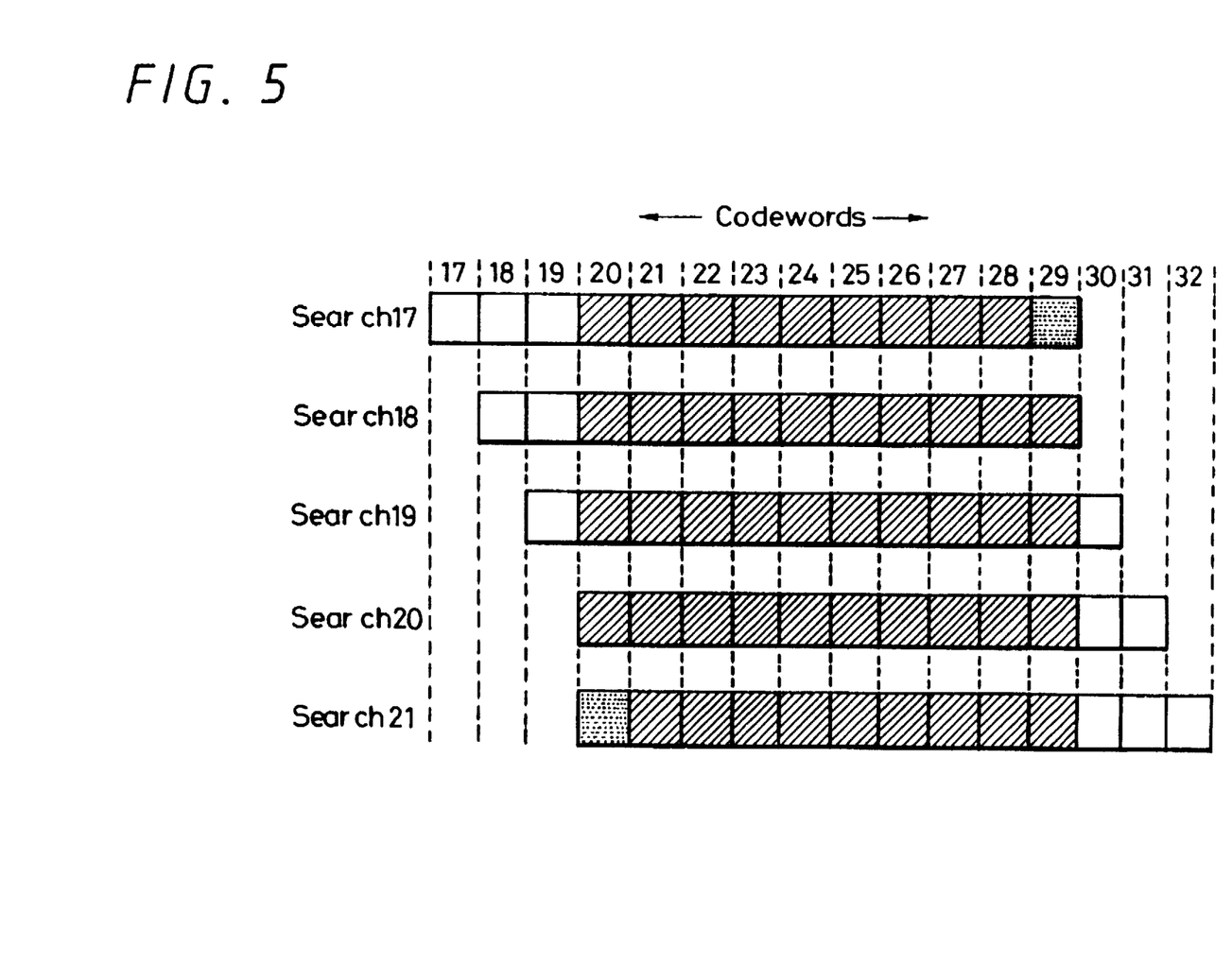
FIG. 5 is a data diagram representing a portion of the table of FIG. 3 to which reference will be made in describing another search operation according to the present invention.

FIG. 5 illustrates horizontally a specific column of the sector of FIG. 3 in which a burst of errors 10 bytes long has occurred. The burst error appears at bytes 20–29. Blank areas represent bytes in which no error was detected. Hatched areas represent bytes in which an error was detected. Stippled areas represent bytes in which an error occurred but was not detected by that particular search.

Search area 17 covers 3 bytes, 17–19, free of errors and 9 bytes, 20–28, in which errors are detected. Search area 18 covers 2 bytes, 18–19, free of errors and 10 bytes, 20–29, in which errors are detected. Search area 19 covers 2 bytes, 19 and 30, free of errors and 10 bytes, 20–29, in which errors are detected. Search area 20 covers 2 bytes, 30–31, free of errors and 10 bytes, 20–29, in which errors are detected. Search area 21 covers 3 bytes, 30–32, free of errors and 9 bytes, 21–29, in which errors are detected. The position and magnitude of the burst error is determined in a straightforward manner by considering the results of Searches 18, 19, and 20.

Figure 6:
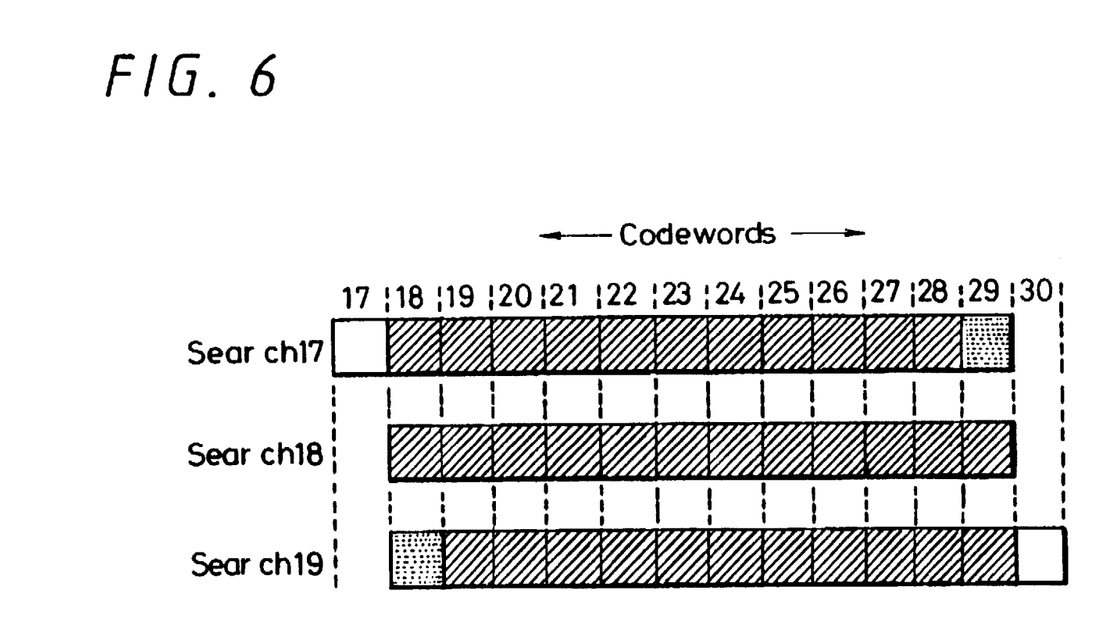
FIG. 6 is a portion of the table of FIG. 3 to which reference will be made in describing the search operation of the present invention.

FIG. 6 illustrates horizontally a specific column of the sector of FIG. 3 in which a burst of errors 12 bytes long has occurred and utilizes the same drawing conventions as in FIG. 5. The burst error appears at bytes 18–29.

Search area 17 covers 1 byte, 17, free of errors, and 11 bytes, 18–28, in which errors are detected. Search area 18 covers zero bytes free of errors and 12 bytes, 18–29, in which errors are detected. Search area 19 covers 1 byte, 30, free of errors and 11 bytes, 19–29, in which errors are detected.

Figure 7:
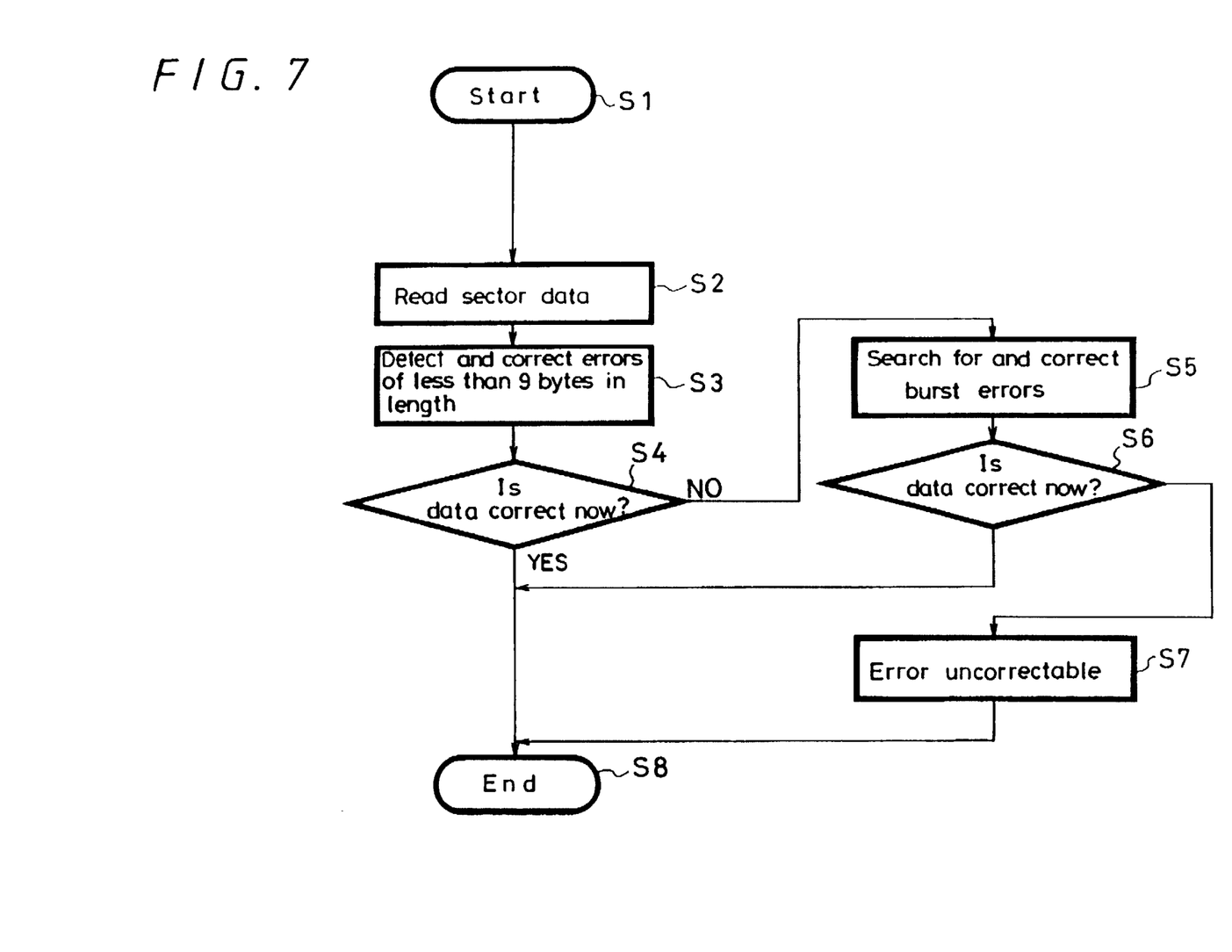
FIG. 7 is a flow diagram of the operation of a decoder according to one embodiment of the present invention.

A flow diagram of the operation of decoder 67, as controlled by CPU 60, is provided in FIG. 7. In step S1 operation begins and proceeds to step S2 whereat, data from a sector of the disk is read from the disk, processed, and supplied to decoder 67 for error correction processing. In step S3, decoder 67 detects and attempts to correct errors found in the data with the CRC and RS parity information. Typically, only errors less than nine bytes in length are fully corrected.

In inquiry S4, the data corrected in step S3 is tested to determine whether it is fully corrected. If the data is correct, this inquiry is answered in the affirmative and processing of the sector is complete as indicated by end step S8. If the data is incorrect, inquiry S4 is answered in the negative and operation of the decoder proceeds to step S5 in which the decoder searches the sector for burst errors and corrects the burst errors where possible. In inquiry S6, the data corrected in step S5 is tested to determine whether it is fully corrected. If the data now is correct, inquiry S6 is answered in the affirmative and processing of the sector is complete, as indicated by end step S8. If the data still is incorrect, the errors in the data are deemed uncorrectable in step S7 and processing is terminated in step S8. Optionally, in step S7, CPU 60 may retrieve an error message stored in ROM 62 and supply the error message to computer 32. Such an error message may include text which is displayed to a user.

Figure 8:
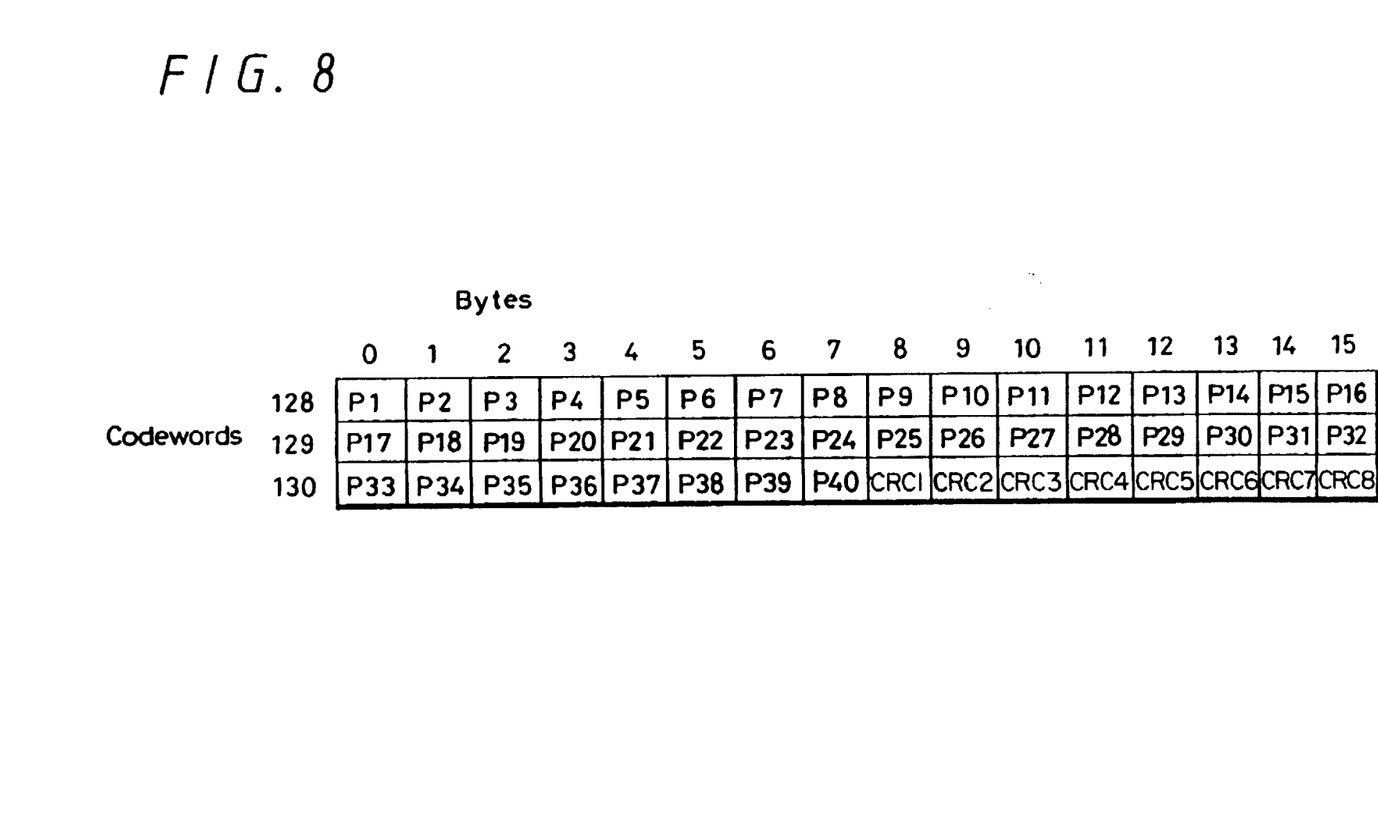
FIG. 8 is a table depicting a portion of the table of FIG. 3 to which reference will be made in describing the storage of additional data according to another embodiment of the present invention.

FIG. 8 illustrates a portion of the sector map of FIG. 3 comprising the U.D. and CRC areas (0, 128)–(15, 130), in which the U.D. bytes have been labeled P1–P40. According to another embodiment of the present invention, these areas are utilized for storing additional error-detecting parity data such as that created by (114, 112, 3) RS coding and (130, 128, 3) RS coding. Preferably, pairs of error-detecting parity bytes are generated for groups of seven or eight codewords of data.

Such additional parity data is especially useful in connection with read-only disks or read-only portions of disks. According to the searching process described above, an entire sector or at least an entire "column" of a sector is searched for burst errors during the search operation. Such processing is time-consuming. By recording bytes P1–P40 with additional parity data corresponding to specified portions of the sector, those portions in which burst errors may have occurred can be more precisely identified. By identifying specific portions of the sector as potentially affected by a burst error, the searching process can be limited to those identified portions. Considerable processing time can be saved by limiting the searching process in this manner.

Alternatively, bytes P1–P40 are recorded with additional parity data pertaining to a sector other than the sector in which bytes P1–P40 are located, preferably an adjacent sector. By separating the parity data from the informational data to be checked, the probability that a burst error will corrupt both the informational data in a sector and the parity data corresponding to that informational data is substantially reduced. In a similar manner, the RS code parity data can be recorded in a sector other than that in which the informational data to which the parity data pertains is located.

Figure 9:
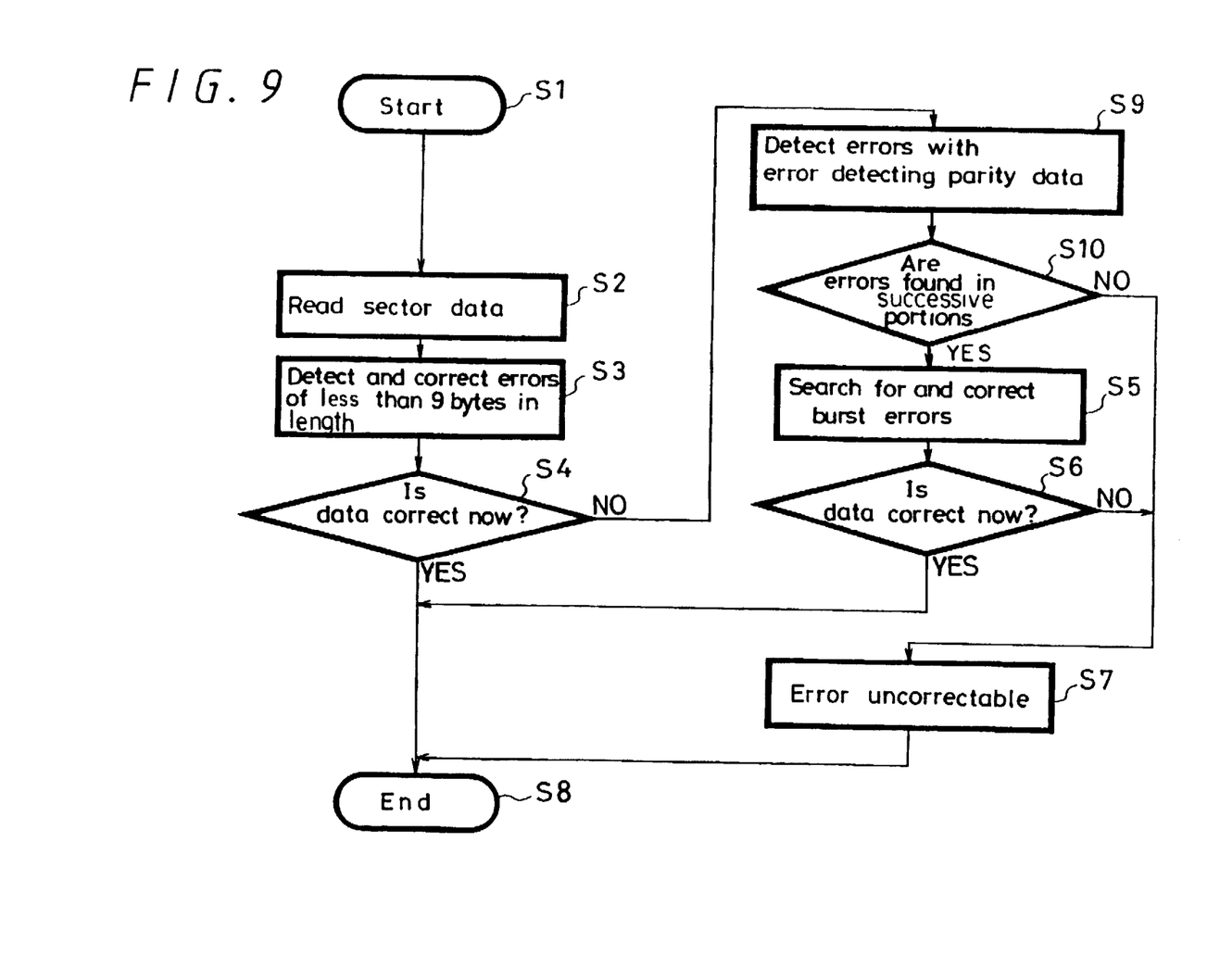
FIG. 9 is a flow diagram of the operation of a decoder according to another embodiment of the present invention.

A flow diagram of the operation of decoder 67, as controlled by CPU 60, is provided in FIG. 9. Steps S1–S8 of FIG. 9 are substantially identical to those of FIG. 7 and thus will not be described further hereinbelow. Following a negative response to inquiry S4, processing proceeds to step S9 where decoder 67 processes the sector with error-detecting parity data P1–P40 to determine the general location of a burst error. For each portion in which an error is detected, decoder 67 generates an error flag.

In inquiry S10, decoder 67 determines whether error flags were generated in a predetermined number of successive portions of the sector. Preferably, the predetermined number is three. If errors occurred in the predetermined number of successive portions, then processing proceeds with step S5; otherwise, processing proceeds with step S7. In step S5, the search process previously described is limited to those portions of the sector for which an error flag was generated.

Although illustrative embodiments of the present invention and modifications thereof have been described in detail herein, it is to be understood that this invention is not limited to these precise embodiments and modifications, and that other modifications and variations may be affected therein by one skilled in the art without departing from the scope and spirit of the invention as defined by the appended claims.

What is claimed is:

1. An error-correcting apparatus for detecting and correcting a burst error affecting a plurality of reproduced signals representing adjacent data words comprising:

grouping means for dividing the reproduced signals into groups of signals, each group containing a predetermined number of adjacent data words and sharing at least one data word with another group;

calculating means, responsive to said groups of signals, for producing a plurality of syndrome signals representing a plurality of syndromes calculated for each group of signals;

determining means for determining the position of an error of less than a predetermined length, if any, in each group of signals as a function of the syndrome signals; and burst error detecting means for detecting a burst error of greater than or equal to said predetermined length in the reproduced signals as a function of the determined positions of a plurality of errors.

2. Apparatus according to claim 1 wherein the plurality of reproduced signals are reproduced from a disk-shaped storage medium.

3. Apparatus according to claim 2 wherein the plurality of reproduced signals are reproduced from one sector of said disk-shaped storage medium.

4. Apparatus according to claim 3, further comprising reproducing means for reproducing the plurality of reproduced signals from said disk-shaped storage medium.

5. Apparatus according to claim 2 wherein said disk-shaped storage medium is a magneto-optical disk.

6. Apparatus according to claim 1 wherein said reproduced signals are encoded with a Reed-Solomon code.

7. An error-correcting apparatus for detecting and correcting a burst error affecting a plurality of reproduced signals representing adjacent data words comprising:

grouping means for dividing the reproduced signals into groups of signals, each group containing a predetermined number of adjacent data words and sharing at least one data word with another group;

calculating means, responsive to said groups of signals, for producing a first plurality of syndrome signals representing a first plurality of syndromes calculated for each group of signals and a second plurality of syndrome signals representing a second plurality of syndromes calculated for each group of signals, said first plurality of syndromes differing from said second plurality of syndromes;

determining means for determining the position of an error of less than a predetermined length, if any, in each group of signals as a function of said first plurality of syndrome signals and for determining the position of an error of less than said predetermined length, if any, in each group of signals as a function of said second plurality of syndrome signals;

verifying means for comparing the positions of errors determined from said first and second pluralities of syndrome signals to verify the positions of the errors; and burst error detecting means for detecting a burst error of greater than or equal to said predetermined length in the reproduced signals as a function of the verified positions of a plurality of errors.

8. An error-correcting apparatus for detecting and correcting a burst error affecting some of a plurality of reproduced signals representing adjacent data words comprising:

reproducing means for producing said plurality of reproduced signals;

grouping means for dividing the reproduced signals into groups of signals, each group containing a predetermined number of adjacent data words and sharing at least one data word with another group;

calculating means, responsive to said groups of signals, for producing a plurality of syndrome signals representing a plurality of syndromes calculated for each group of signals;

determining means for determining the position of an error of less than a predetermined length, if any, in each group of signals as a function of the syndrome signals; and burst error detecting means for detecting a burst error of greater than or equal to said predetermined length in the reproduced signals as a function of the determined positions of a plurality of errors.

9. Apparatus according to claim 8 further comprising:

identifying means for identifying sets of reproduced signals exhibiting a likelihood of being affected by a burst error; and wherein said grouping means groups only reproduced signals contained in said sets.

10. An error-correcting apparatus for detecting and correcting errors affecting one or more of a plurality of reproduced signals representing data words comprising:

reproducing means for producing said plurality of reproduced signals;

error correcting means for correcting errors of less than a predetermined length in said plurality of reproduced signals; and search means for searching said reproduced signals for burst errors of greater than or equal to said predetermined length.

11. Apparatus according to claim 10 further comprising burst error correcting means for correcting burst errors in said plurality of reproduced signals.

12. An error-correcting method for detecting and correcting a burst error affecting a plurality of reproduced signals representing adjacent data words comprising the steps of:

dividing the reproduced signals into groups of signals, each group containing a predetermined number of adjacent data words and sharing at least one data word with another group;

producing, in response to said groups of signals, a plurality of syndrome signals representing a plurality of syndromes calculated for each group of signals;

determining the position of an error of less than a predetermined length, if any, in each group of signals as a function of the syndrome signals; and detecting a burst error of greater than or equal to said predetermined length in the reproduced signals as a function of the determined positions of a plurality of errors.

13. An error-correcting method for detecting and correcting a burst error affecting a plurality of reproduced signals representing adjacent data words comprising the steps of:

dividing the reproduced signals into groups of signals, each group containing a predetermined number of adjacent data words and sharing at least one data word with another group;

producing, in response to said groups of signals, a first plurality of syndrome signals representing a first plurality of syndromes calculated for each group of signals and a second plurality of syndrome signals representing a second plurality of syndromes calculated for each group of signals, said first plurality of syndromes differing from said second plurality of syndromes;

determining the position of an error of less than a predetermined length, if any, in each group of signals as a function of said first plurality of syndrome signals and determining the position of an error of less than said predetermined length, if any, in each group of signals as a function of said second plurality of syndrome signals;

comparing the positions of errors determined from said first and second pluralities of syndrome signals to verify the positions of the errors; and detecting a burst error of greater than or equal to said predetermined length in the reproduced signals as a function of the verified positions of a plurality of errors.

14. An error-correcting method for detecting and correcting a burst error affecting some of a plurality of reproduced signals representing adjacent data words comprising the steps of:

producing said plurality of reproduced signals;

dividing the reproduced signals into groups of signals, each group containing a predetermined number of adjacent data words and sharing at least one data word with another group;

producing, in response to said groups of signals, a plurality of syndrome signals representing a plurality of syndromes calculated for each group of signals;

determining the position of an error of less than a predetermined length, if any, in each group of signals as a function of the syndrome signals; and detecting a burst error of greater than or equal to said predetermined length in the reproduced signals as a function of the determined positions of a plurality of errors.

15. Method according to claim 14 further comprising the step of:

identifying sets of reproduced signals exhibiting a likelihood of being affected by a burst error; and wherein only reproduced signals contained in said sets are grouped in the grouping step.

16. An error-correcting method for detecting and correcting errors affecting one or more of a plurality of reproduced signals representing data words comprising the steps of:

producing said plurality of reproduced signals;

correcting errors of less than a predetermined length in said plurality of reproduced signals; and searching said reproduced signals for burst errors of greater than or equal to said predetermined length.

17. Method according to claim 16 further comprising the step of correcting burst errors in said plurality of reproduced signals.

* * * * *